(12) United States Patent
Wang et al.

(10) Patent No.: US 10,263,143 B2
(45) Date of Patent: Apr. 16, 2019

(54) SEMICONDUCTOR CHIP

(71) Applicant: OSRAM Opto Semiconductors GmbH, Regensburg (DE)

(72) Inventors: Xue Wang, Regensburg (DE); Markus Broell, Regensburg (DE); Stefan Barthel, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/948,650

(22) Filed: Apr. 9, 2018

(65) Prior Publication Data
US 2018/0301595 A1 Oct. 18, 2018

(30) Foreign Application Priority Data

Apr. 12, 2017 (DE) .................... 10 2017 107 918

(51) Int. Cl.
| | |
|---|---|
| *H01L 29/06* | (2006.01) |
| *H01L 33/06* | (2010.01) |
| *H01L 31/0304* | (2006.01) |
| *H01L 31/0352* | (2006.01) |
| *H01L 33/30* | (2010.01) |

(52) U.S. Cl.
CPC ........ *H01L 33/06* (2013.01); *H01L 31/03046* (2013.01); *H01L 31/035263* (2013.01); *H01L 33/30* (2013.01)

(58) Field of Classification Search
CPC ......... H01L 21/02507; H01L 21/02546; H01L 21/02463; H01L 21/02395; H01L 33/04; H01L 33/30; H01L 31/035263; H01L 31/03046; H01L 31/035236
See application file for complete search history.

(56) References Cited

U.S. PATENT DOCUMENTS

| | | | |
|---|---|---|---|
| 5,038,187 A | 8/1991 | Zhou | |
| 9,685,587 B2* | 6/2017 | Atanackovic | ......... H01L 33/325 |
| 2014/0077157 A1* | 3/2014 | Nakamura | ............... H01L 33/32 257/13 |
| 2017/0170347 A1* | 6/2017 | Miura | ............. H01L 31/035236 |

FOREIGN PATENT DOCUMENTS

DE    102008032318 A1    10/2009

* cited by examiner

*Primary Examiner* — Hsien Ming Lee
(74) *Attorney, Agent, or Firm* — McDermott Will & Emery LLP

(57) ABSTRACT

A semiconductor chip (20) is described comprising a semiconductor layer sequence (10) based on a phosphide compound semiconductor material or arsenide compound semiconductor material wherein the semiconductor layer sequence (10) contains a p-type semiconductor region (4) and an n-type semiconductor region (2). The n-type semiconductor region (2) comprises a superlattice structure (20) for improving current spreading, wherein the superlattice structure (20) has a periodic array of semiconductor layers (21, 22, 23, 24). A period of the superlattice structure (20) has at least one undoped first semiconductor layer (21) and a doped second semiconductor layer (22), wherein an electronic band gap $E_2$ of the doped second semiconductor layer (22) is larger than an electronic band gap $E_1$ of the undoped first semiconductor layer (21).

13 Claims, 3 Drawing Sheets

SEMICONDUCTOR CHIP

Figure 1:
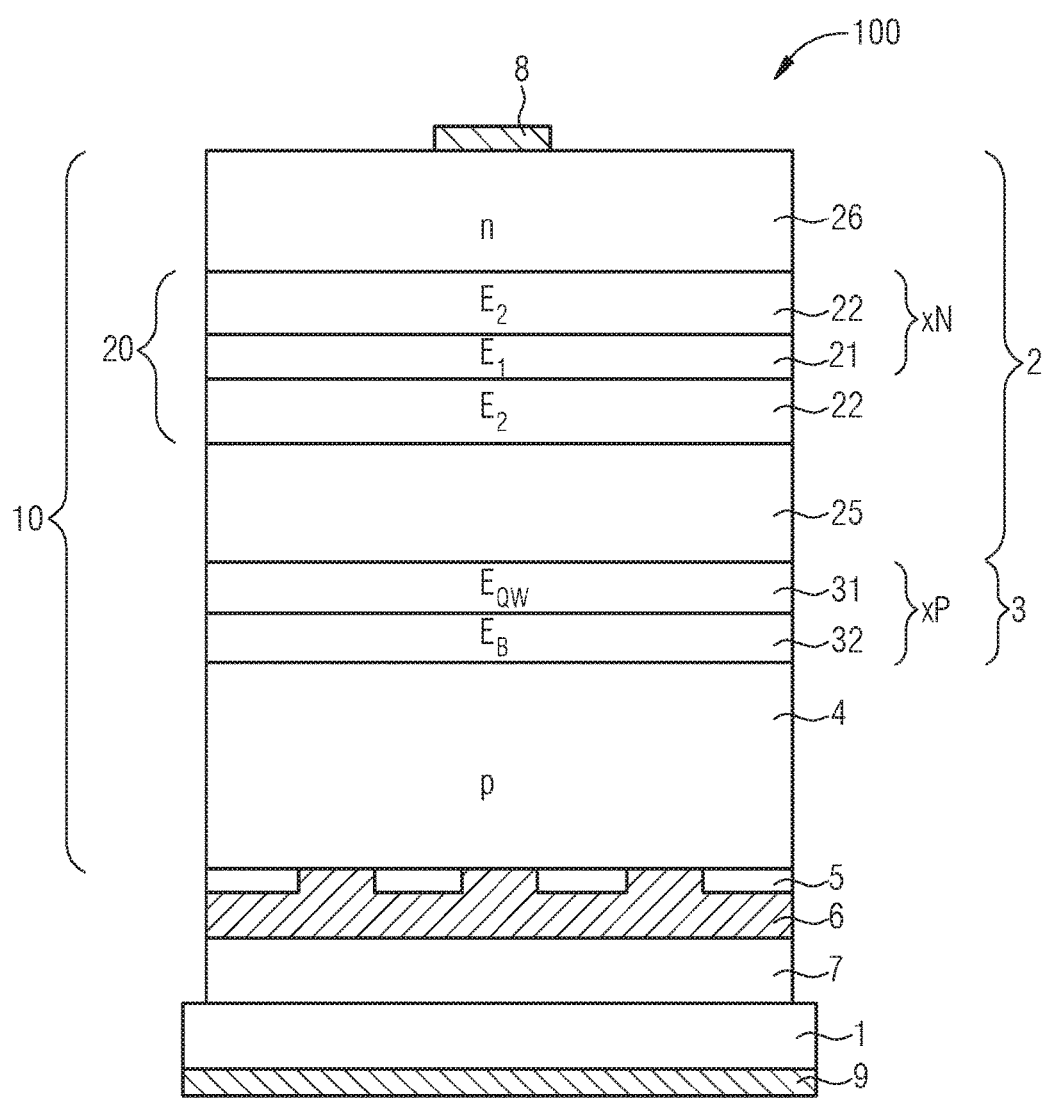

The invention concerns a semiconductor chip, in particular a semiconductor chip based on a phosphide compound semiconductor material or arsenide compound semiconductor material.

This patent application claims the priority of German patent application 10 2017 107 918.1, the disclosure content of which is hereby incorporated by reference.

In electronic or optoelectronic semiconductor chips such as light-emitting diode chips, a relatively thick current spreading layer of a semiconductor material with good electrical conductivity is usually arranged between the electrical contact and the light-emitting semiconductor layer sequence in order to achieve an as uniform as possible current flow through the active layer.

It has been found that with comparatively thick current spreading layers of AlGaAs a good current spreading can be achieved, but on the other hand a not inconsiderable portion of the emitted radiation is absorbed. The absorption of a thick current spreading layer is not negligible, especially when the emitted radiation is short-wave and/or the aluminium content in the current spreading layer is low.

An objected to be achieved is specifying a semiconductor chip that is characterized by an improved current spreading, especially with comparatively low absorption in the current spreading layer.

This object is achieved by a semiconductor chip according to claim 1. Advantageous embodiments and developments of the invention are subject of the dependent claims.

According to at least one embodiment, the semiconductor chip contains a semiconductor layer sequence based on a phosphide compound semiconductor material or an arsenide compound semiconductor material. In the present context, "based on a phosphide compound semiconductor material" means that one or more layers of the semiconductor layer sequence comprise a III-phosphide compound semiconductor material, in particular $In_xAl_yGa_{1-x-y}P$, where $0 \leq x \leq 1$, $0 \leq y \leq 1$ and $x+y \leq 1$, preferably $In_{0.5}Al_xGa_{0.5-x}P$, where $0 \leq x \leq 0.5$, or $Al_nGa_{1-n}As_{1-m}P_m$, where $0 \leq n \leq 1$ and $0 < m < 1$. Correspondingly, "based on an arsenide compound semiconductor material" in the present context means that one or more layers of the semiconductor layer sequence comprise a III-arsenide compound semiconductor material, in particular $In_xAl_yGa_{1-x-y}As$, where $0 \leq x \leq 1$, $0 \leq y \leq 1$ and $x+y \leq 1$, preferably $Al_yGa_{1-y}As$, where $0 \leq y \leq 1$. The respective material does not necessarily have to have a mathematically exact composition according to the above formula. Rather, it may contain one or more dopants and additional components. For the sake of simplicity, however, the above formulas contain only the essential constituents of the crystal lattice (In, Al, Ga, P, As), even if they may be partially replaced by small quantities of other substances.

The semiconductor layer sequence contains in particular a p-type semiconductor region and an n-type semiconductor region. In the case of an optoelectronic semiconductor chip, the semiconductor chip contains an active layer located between the p-type semiconductor region and the n-type semiconductor region. The active layer is provided in particular for the emission of electromagnetic radiation. The optoelectronic semiconductor chip can in particular be an LED chip that is preferably suitable for the emission of light in the visible or infrared spectral range. Alternatively, it is also possible that the active layer is a radiation-receiving layer and the optoelectronic semiconductor chip is a detector.

The active layer can be formed as a pn junction, double heterostructure, single quantum well structure or multiple quantum well structure. The term quantum well structure encompasses any structure in which charge carriers undergo a quantization of their energy states by confinement. In particular, the description quantum well structure does not contain any information about the dimensionality of quantization. It includes inter alia quantum wells, quantum wires or quantum dots and any combination of these structures.

According to at least one embodiment, the n-type semiconductor region has a superlattice structure to improve current spreading. The superlattice structure has a periodic arrangement of semiconductor layers, i.e. the arrangement of semiconductor layers in the superlattice structure is repeated at least once or preferably multiple times. A period of the superlattice structure comprises at least one undoped first semiconductor layer and one doped second semiconductor layer. An undoped layer is to be understood here and in the following as a nominally undoped layer, i.e. a layer that is not actively doped during production. This does not rule out the possibility that small quantities of foreign atoms may inadvertently enter the undoped layer during production and/or through diffusion in the semiconductor layer sequence.

An electronic band gap $E_2$ of the doped second semiconductor layer is advantageously larger than an electronic band gap $E_1$ of the undoped first semiconductor layer. The superlattice structure therefore contains advantageously alternating undoped first semiconductor layers with smaller electronic band gap $E_1$ and doped second semiconductor layers with larger electronic band gap $E_2$.

It has been found that with such a periodic arrangement of undoped first semiconductor layers and doped second semiconductor layers, a two-dimensional electron gas forms advantageously in the undoped first semiconductor layers. The two-dimensional electron gas increases the conductivity of the superlattice structure. In particular, the specific resistance of the superlattice structure is reduced, resulting in increased transverse conductivity. By means of the superlattice structure in the n-type semiconductor region described here, a particularly homogeneous current injection into the semiconductor chip, especially into the active layer of an optoelectronic semiconductor chip, can be achieved.

In a preferred configuration, the undoped first semiconductor layer comprises $In_{0.5}Al_{x1}Ga_{0.5-x1}P$, where $0 \leq x1 \leq 0.27$, or $Al_{y1}Ga_{1-y1}As$, where $0 \leq y1 \leq 0.4$. The doped second semiconductor layer preferably comprises $In_{0.5}Al_{x2}Ga_{0.5-x2}P$, where $0 \leq x2 \leq 0.5$ and $x1 < x2$, or $Al_{y2}Ga_{1-y2}As$, where $0 < y2 \leq 1$ and $y1 < y2$. In this configuration, the doped second semiconductor layer has a higher aluminum content than the undoped first semiconductor layer. In the case of arsenide and phosphide compound semiconductors, the electronic band gap is enlarged with increasing aluminum content. Due to the higher aluminum content, it can be achieved that the doped second semiconductor layer has a larger electronic band gap than the undoped first semiconductor layer.

The doped second semiconductor layer is advantageously n-doped and preferably contains Te or Si as dopant. Preferably, the dopant concentration in the doped second semiconductor layer is at least $1*10^{16}$ $cm^{-3}$. In particular, the dopant concentration in the doped second semiconductor layer can have a value between $1*10^{16}$ $cm^{-3}$ and $1*10^{20}$ $cm^{-3}$, preferably between $1*10^{17}$ $cm^{-3}$ and $1*10^{19}$ $cm^{-3}$, for example about $1*10^{18}$ $cm^{-3}$.

In an embodiment, the thickness of the undoped first semiconductor layer is between 1 nm and 30 nm, preferably between 3 nm and 15 nm and particularly preferred between 5 nm and 10 nm. The thickness of the doped second semiconductor layer is, for example, between 5 nm and 200 nm, preferably between 20 nm and 30 nm.

In a preferred embodiment of the semiconductor chip, the undoped first semiconductor layer is arranged in the superlattice structure in each case between an undoped first intermediate layer and an undoped second intermediate layer. A period of the superlattice structure in this configuration consists of four layers, wherein in each period the undoped first intermediate layer, the undoped first semiconductor layer, the undoped second intermediate layer and the doped second semiconductor layer follow one another. The undoped intermediate layers in the superlattice structure ensure that the undoped first semiconductor layer and the doped second semiconductor layer do not directly adjoin each other in a period of the superlattice structure. In this way, a scattering of electrons at the interfaces between the undoped first semiconductor layers and the doped second semiconductor layers in the superlattice structure is reduced.

In a preferred configuration, the first undoped intermediate layer and the second undoped intermediate layer each have the same semiconductor material as the doped second semiconductor layer. In particular, the first undoped intermediate layer and the second undoped intermediate layer may have essentially the same electronic band gap as the doped second semiconductor layer.

The first undoped intermediate layer and the second undoped intermediate layer are preferably each between 0.5 nm and 20 nm thick.

According to at least one embodiment, the superlattice structure has between 5 and 100 periods, preferably between 30 and 50 periods. A high electrical conductivity can be achieved with a number of periods in this range, whereby the overall thickness of the superlattice structure can still be kept advantageously low.

The specific resistance of the superlattice structure in a preferred configuration is less than 0.05 Ωcm, for example 0.01 Ωcm.

In a preferred configuration, the semiconductor chip is an optoelectronic semiconductor chip with an active layer. The active layer of the optoelectronic semiconductor chip is preferably formed as a single or multiple quantum well structure comprising at least one quantum well layer and at least one barrier layer. In this configuration, the undoped first semiconductor layers of the superlattice structure in the current spreading layer have a larger electronic band gap than the at least one quantum well layer of the quantum well structure.

The invention is explained in more detail in the following on the basis of examplary embodiments in connection with FIGS. 1 to 4.

Figure 2:
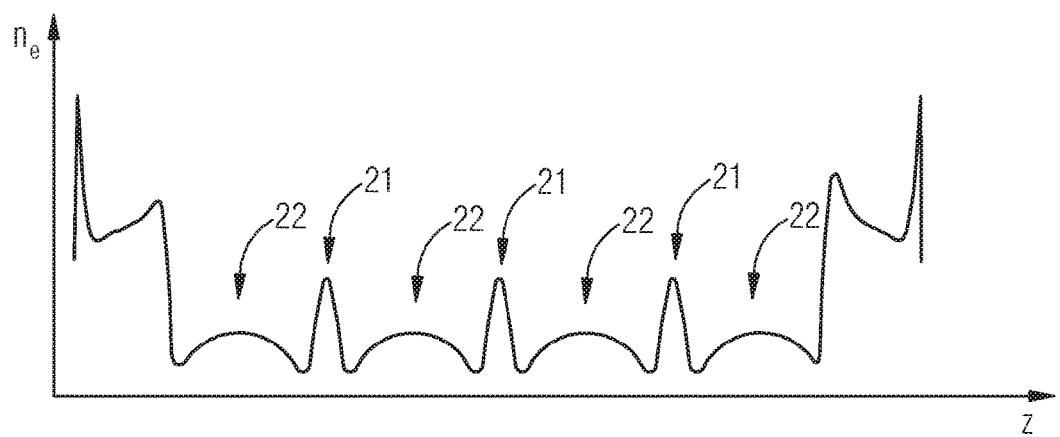
Figure 3:
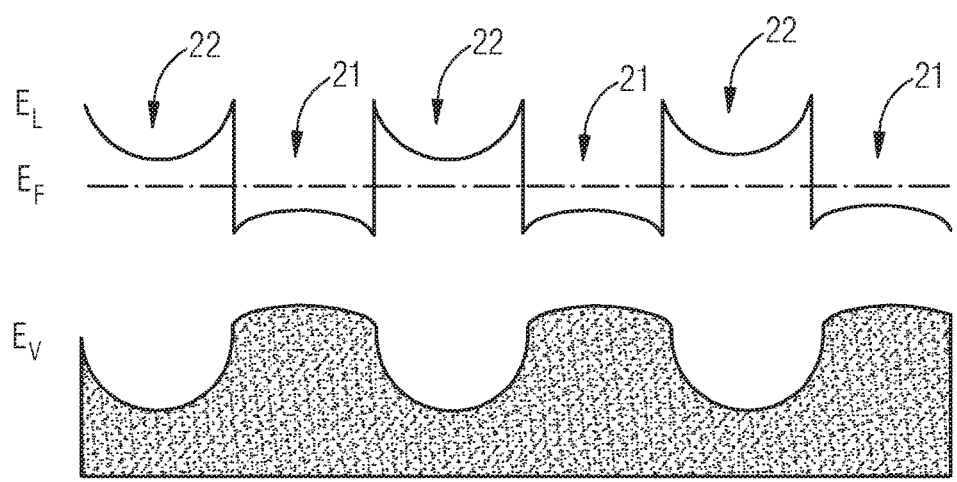
Figure 4:
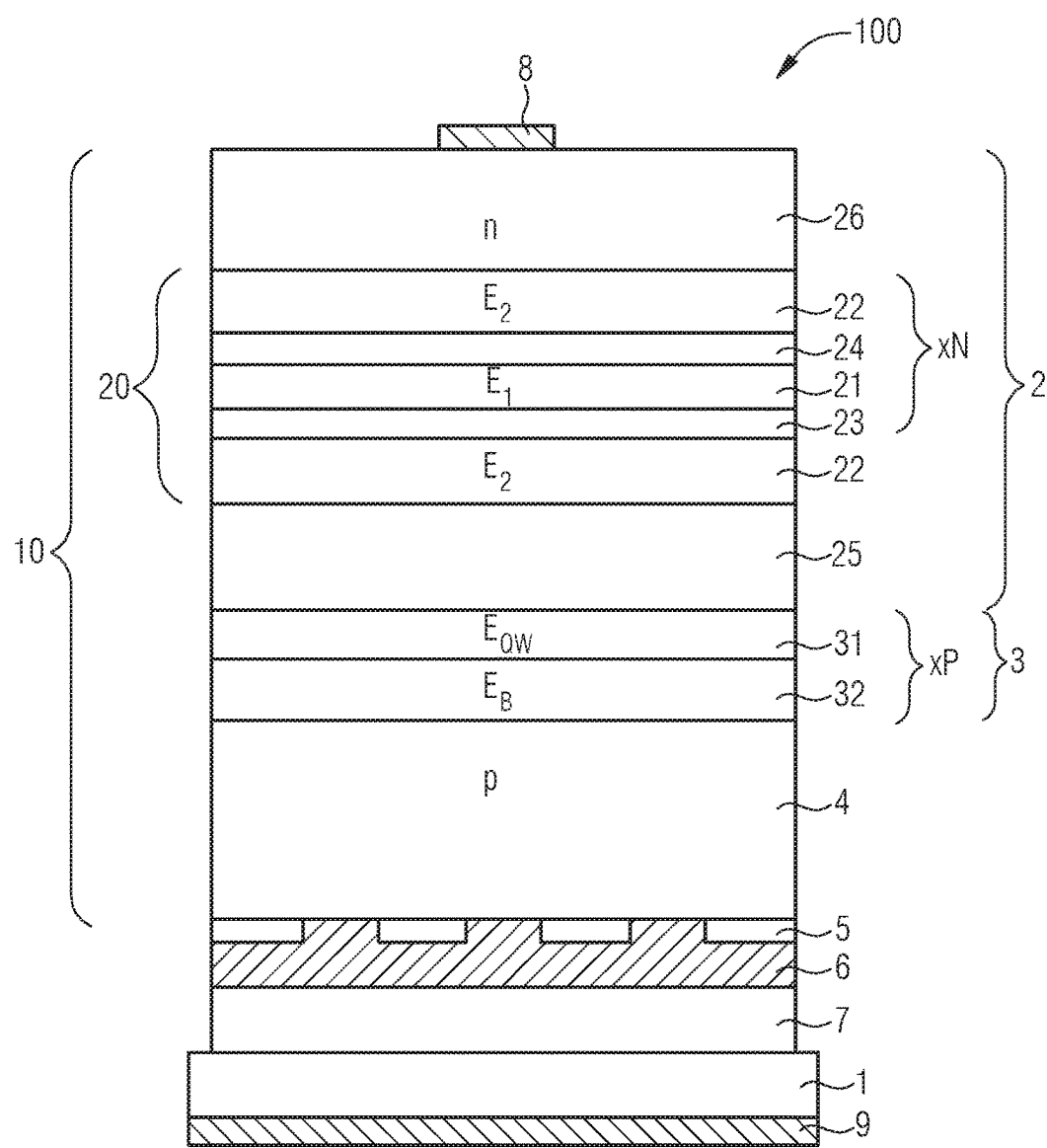

In the figures:

FIG. 1 shows a schematic representation of a cross-sectional view of an optoelectronic semiconductor chip according to a first embodiment, FIG. 2 shows a schematic graphic representation of the electron density $n_e$ in the superlattice structure for an exemplary embodiment as a function of a local coordinate z running perpendicular to the layer planes, FIG. 3 shows a schematic graphic representation of the electronic band structure in the superlattice structure according to an embodiment, and FIG. 4 shows a schematic representation of a cross-sectional view of an optoelectronic semiconductor chip according to a second embodiment.

Identical or similar elements are provided with the same reference signs in the figures. The sizes of the individual elements and the proportions of the elements among each other are not to be regarded as true to scale.

The optoelectronic semiconductor chip 100 shown in FIG. 1 contains a semiconductor layer sequence 10, which has an n-type semiconductor region 2 and a p-type semiconductor region 4. An active layer 3 is arranged between the n-type semiconductor region 2 and the p-type semiconductor region 4.

The semiconductor layer sequence 10 is preferably based on a phosphide compound semiconductor, i.e. one or more semiconductor layers contained in the semiconductor layer sequence 10 have in particular $In_xGa_yAl_{1-x-y}P$, where $0 \le x \le 1$, $0 \le y \le 1$ and $x+y \le 1$, preferably $In_{0.5}Al_xGa_{0.5-x}P$, where $0 \le x \le 0.5$. In particular, one or more layers of the n-type semiconductor region 2, the active layer 3, and the p-type semiconductor region 4 are formed from phosphide compound semiconductor materials. However, it cannot be ruled out that semiconductor layer sequence 10 may contain one or more layers of another III-V compound semiconductor material, such as one or more arsenide compound semiconductor layers or arsenide phosphide compound semiconductor layers.

In the embodiment, the active layer 3 is formed as a quantum well structure, in particular a multiple quantum well structure. In the embodiment, the quantum well structure, for example, has a periodic arrangement of alternating quantum well layers 31 and barrier layers 32. The quantum well structure has a number of P periods, wherein P for example is between 1 and 120.

The quantum well layers 31 intended for radiation generation have an electronic band gap $E_{QW}$ which is smaller than an electronic band gap $E_B$ of the barrier layers 32.

The p-type semiconductor region 4 can contain one or more p-doped semiconductor layers. However, it cannot be ruled out that the p-type semiconductor region 4 contains one or more undoped layers. Accordingly, the n-type semiconductor region 2 may contain one or more n-doped layers and one or more undoped layers.

In the optoelectronic semiconductor chip 100, the n-type semiconductor region 2 has a superlattice structure 20, which acts as a current spreading layer. In addition to the superlattice structure 20, the n-type semiconductor region 2 can include further semiconductor layers 25, 26. The superlattice structure 20 has a periodic sequence of semiconductor layers 21, 22, wherein the number of periods is N. With increasing number of periods the electrical conductivity can be increased, but on the other hand the absorption can increase due to the increasing total thickness. The number N of periods is advantageously between 5 and 70.

Preferably, the number N of periods is between 30 and 50, which makes it possible to achieve good electrical conductivity with little or no absorption. Each period of the superlattice structure 20 comprises an undoped first semiconductor layer 21 and a doped second semiconductor layer 22. The doped semiconductor layers 22 each have an electronic band gap $E_2$, which is larger than the electronic band gap $E_1$ of the undoped first semiconductor layers 21. The undoped first semiconductor layers 21 form potential wells between the doped second semiconductor layers 22 in the superlattice structure. The band gap $E_1$ of the undoped first semiconductor layers 21 that form the potential wells is larger than the band gap $E_{QW}$ of quantum well layers 31 in the multiple quantum well structure, which functions as active layer 3. In contrast to quantum well layers 31, the potential wells formed by the undoped first semiconductor layers 21 are not used to generate radiation.

In order to achieve the larger electronic band gap $E_2$, it is advantageous if the doped second semiconductor layers 22 have a higher aluminum content than the undoped first semiconductor layers 21. The undoped first semiconductor layers 21 in particular can have $In_{0.5}Al_{x1}Ga_{0.5-x1}P$, where $0 \le x1 \le 0.27$ or $Al_{y1}Ga_{1-y1}As$, where $0 \le y1 \le 0.4$. The doped second semiconductor layers 22 in particular can have $In_{0.5}Al_{x1}Ga_{0.5-x1}P$, where $0 < x2 \le 0.5$ and $x2 > x1$, or $Al_{y2}Ga_{1-y2}As$, where $y2 > y1$.

For example, the undoped first semiconductor layer 21 comprises $In_{0.5}Al_{0.1}Ga_{0.4}P$ and the doped second semiconductor layer 22 comprises $In_{0.5}Al_{0.28}Ga_{0.22}P$. The doped second semiconductor layer 22 is preferably doped with Si or Te and has a dopant concentration of e.g. $1*10^{18}$ cm$^{-3}$. For example, the thickness of the undoped first semiconductor layer 21 is about 7 nm and the thickness of the doped second semiconductor layer 22 is about 30 nm.

In the undoped first semiconductor layers 21, which are arranged in the superlattice structure 20 between the doped second semiconductor layers 22, a two-dimensional electron gas is advantageously formed, which increases the electrical conductivity advantageously. In particular, by means of the superlattice structure 20 it can be achieved that the specific resistance is not more than 0.05 Ωcm. The optoelectronic semiconductor chip 100 is therefore characterized by a good current spreading, which leads to a particularly homogeneous radiation emission over the surface of the optoelectronic semiconductor chip 100. In particular, the superlattice structure 20 has the advantage that a good current spreading can already be achieved with a comparatively thin n-type semiconductor region 2. Due to the superlattice structure in the n-type semiconductor region 2, in particular the conductivity can be increased without increasing the total thickness of the n-type semiconductor region 2, or the total thickness can be reduced at a given conductivity compared to a homogeneous current spreading layer.

The embodiment of the optoelectronic semiconductor chip 100 shown here is a so-called thin-film LED in which the semiconductor layer sequence 10 is detached from its original growth substrate. The original growth substrate is removed from the n-type semiconductor region 2, which in this embodiment is located on the radiation exit side of the optoelectronic semiconductor chip 100. On the side opposite the original growth substrate, the optoelectronic semiconductor chip 100 is applied to a carrier substrate 1 with at least one connection layer 7, for example a solder layer. Seen from the active layer 3, the p-type semiconductor region 4 faces the carrier substrate 1. The carrier substrate 1 is not the same as the growth substrate used for epitaxial growth of semiconductor layer sequence 10. The carrier substrate 1 can, for example, contain a semiconductor material such as silicon, germanium or molybdenum or a ceramic.

The p-type semiconductor region 4 adjoins a mirror layer 6 in certain areas. Mirror layer 6 is provided to reflect the radiation emitted by the active zone 3 in the direction of the carrier substrate 1 to the opposite radiation exit surface on the surface of the n-type semiconductor region 2. The mirror layer 6 can contain or consist of silver or gold in particular. Silver and gold are characterized by a high reflectivity.

In the exemplary embodiment shown here, a dielectric layer 5 is arranged between the p-type semiconductor region 4 and the mirror layer 6 in certain areas, which dielectric layer 5 can be a silicon oxide layer in particular. Due to the comparatively low refractive index of the dielectric material of dielectric layer 5, for example $SiO_2$, dielectric layer 5 can cause a total reflection of part of the radiation emitted in the direction of the carrier substrate 1 towards the radiation exit surface. The reflective effect of metallic mirror layer 6 is therefore further enhanced by dielectric layer 5. Since the dielectric layer 5 is not electrically conductive, mirror layer 6 is connected to p-type semiconductor region 4 through one or more through-holes in dielectric layer 5.

An n connection layer 8 and a p connection layer 9 are provided for electrical contacting of the optoelectronic semiconductor chip 100. The n-connection layer 8 for electrical contacting from the n-side can, for example, be arranged at the radiation exit side on the n-type semiconductor region 2. For example, the p connection layer 9 may be located on the rear side of carrier substrate 1 if an electrically conductive carrier substrate 1 is used.

FIG. 2 shows schematically the electron density $n_e$ as a function of a vertical coordinate z in an embodiment of the superlattice structure. For simplification, a superlattice structure with only three periods is shown here, but wherein the superlattice structure can actually have between 5 and 70, preferably between 30 and 50 periods, for example. In the undoped first semiconductor layers 21, which are arranged between the doped second semiconductor layers 22, there is a comparatively high electron density. Due to the high electron density and high mobility of the electrons in the undoped first semiconductor layers 21, the electrical conductivity of the superlattice structure increases advantageously.

FIG. 3 shows schematically the course of the conduction band edge $E_L$, the Fermi energy $E_F$ and the valence band edge $E_V$ in an example of the superlattice structure. The conduction band edge of the undoped first semiconductor layers 21 is advantageously below the Fermi energy. The conduction band of the undoped first semiconductor layers 21 therefore contains free electrons which form a so-called two-dimensional electron gas. The free electrons in the undoped first semiconductor layers 21 have a high mobility, which increases the electrical conductivity of the superlattice structure.

The second examplary embodiment of the optoelectronic semiconductor chip 100 shown in FIG. 4 differs from the optoelectronic semiconductor chip shown in FIG. 1 in that the undoped first semiconductor layers 21 are arranged in the superlattice structure 20 in each case between an undoped first intermediate layer 23 and an undoped second intermediate layer 24.

In this embodiment, the periods of the superlattice structure 20 each have four layers, wherein in the periods the undoped first intermediate layer 23, the undoped first semiconductor layer 21, the undoped second intermediate layer 24 and the doped second semiconductor layer 22 follow one another. The undoped first intermediate layer 23 and the undoped second intermediate layer 24 each have substantially the same electronic band gap as the doped second semiconductor layer 22, in particular the undoped first intermediate layer 23 and the undoped second intermediate layer 24 may each have the same semiconductor material as the doped second semiconductor layer 22 apart from the doping.

For example, the undoped first intermediate layer 23 comprises $In_{0.5}Al_{0.28}Ga_{0.22}P$, the undoped first semiconductor layer 21 comprises $In_{0.5}Al_{0.1}Ga_{0.4}P$, the undoped second intermediate layer 23 comprises $In_{0.5}Al_{0.28}Ga_{0.22}P$ and the doped second semiconductor layer 22 comprises $In_{0.5}Al_{0.28}Ga_{0.22}P$. The doped second semiconductor layer 22 is preferably doped with Si or Te and has a dopant concentration of e.g. $1*10^{18}$ cm$^{-3}$.

For example, the thickness of the undoped first intermediate layer 23 is about 6 nm, the thickness of the undoped first semiconductor layer 21 about 7 nm, the thickness of the undoped second intermediate layer 24 about 4 nm and the thickness of the doped second semiconductor layer 22 about 25 nm.

The undoped first semiconductor layers 21 of the superlattice structure each form potential wells in which a high electron density is present. In particular, a two-dimensional electron gas can form in the undoped first semiconductor layers 21, as in the first embodiment, which causes an increase in conductivity. If the undoped first semiconductor layers 21 were directly connected to the doped second semiconductor layers 22 at the interface between the undoped first semiconductor layers 21 and the doped second semiconductor layers 22, more electrons would be scattered at phonons. The arrangement of the undoped first semiconductor layers 21 between the undoped intermediate layers 23, 24 has the advantage that the scattering of electrons is reduced.

In other respects, the embodiment of FIG. 4 corresponds to the embodiment shown in FIG. 1 with regard to its mode of operation and other advantageous configurations.

The invention is not limited by the description based on the embodiments. Rather, the invention includes each new feature and each combination of features, which includes in particular each combination of features in the claims, even if this feature or this combination itself is not explicitly indicated in the claims or embodiments.

LIST OF REFERENCE SIGNS 1 carrier
2 n-type semiconductor region
3 active layer
4 p-Type semiconductor region
5 dielectric layer
6 mirror layer
7 connection layer
8 n connection layer
9 p connection layer
10 semiconductor layer sequence
20 superlattice structure
21 undoped first semiconductor layer
22 doped second semiconductor layer
23 undoped first intermediate layer
24 undoped second intermediate layer
31 quantum well layer
32 barrier layer
100 optoelectronic semiconductor chip

The invention claimed is:

1. A semiconductor chip having a semiconductor layer sequence having one or more layers comprising a III-phosphide compound semiconductor material or III-arsenide compound semiconductor material, wherein the semiconductor layer sequence contains a p-type semiconductor region and an n-type semiconductor region, wherein
the n-type semiconductor region comprises a superlattice structure for improving current spreading, the superlattice structure having a periodic arrangement of semiconductor layers,
a period of the superlattice structure has at least one undoped first semiconductor layer and a doped second semiconductor layer, an electronic band gap $E_2$ of the doped second semiconductor layer being larger than an electronic band gap $E_1$ of the undoped first semiconductor layer,
the undoped first semiconductor layer is arranged in the superlattice structure in each case between an undoped first intermediate layer and an undoped second intermediate layer.

2. The semiconductor chip according to claim 1,
wherein the undoped first semiconductor layer comprises $In_{0.5}Al_{x1}Ga_{0.5-x1}P$, where $0 \le x1 \le 0.27$, or $Al_{y1}Ga_{1-y1}As$, where $0 \le y1 < 0.4$, and the doped second semiconductor layer comprises $In_{0.5}Al_{x2}Ga_{0.5-x2}P$, where $0 \le x2 \le 0.5$ and $x1 < x2$, or $Al_{y2}Ga_{1-y2}As$, where $0 < y2 \le 1$ and $y1 < y2$.

3. The semiconductor chip according to claim 2,
wherein the aluminum content x1 of the undoped first semiconductor layer is less than 0.25.

4. The semiconductor chip according to claim 1,
wherein the doped second semiconductor layer has a dopant concentration between $1 \times 10^{16}$ cm$^{-3}$ and $1 \times 10^{20}$ cm$^{-3}$.

5. The semiconductor chip according to claim 1,
wherein a thickness of the undoped first semiconductor layer is between 3 nm and 15 nm.

6. The semiconductor chip according to claim 1,
wherein a thickness of the doped second semiconductor layer is between 20 nm and 30 nm.

7. The semiconductor chip according to claim 1,
wherein the undoped first intermediate layer and the undoped second intermediate layer have the same electronic band gap $E_2$ as the doped second semiconductor layer.

8. The semiconductor chip according to claim 1,
wherein a thickness of the undoped first intermediate layer and/or the undoped second intermediate layer is between 0.5 nm and 20 nm.

9. The semiconductor chip according to claim 1,
wherein the superlattice structure has between 5 and 70 periods.

10. The semiconductor chip according to claim 1,
wherein a specific resistance of the superlattice structure is less than 0.05 $\Omega$cm.

11. The semiconductor chip according to claim 1,
wherein the semiconductor chip is an optoelectronic semiconductor chip, and the optoelectronic semiconductor chip has an active layer disposed between the p-type semiconductor region and the n-type semiconductor region.

12. The semiconductor chip according to claim 11,
wherein the active layer has a quantum well structure having at least one quantum well layer and at least one barrier layer, and wherein the electronic band gap $E_1$ of the undoped first semiconductor layer of the superlattice structure is larger than an electronic band gap $E_{QW}$ of the at least one quantum well layer of the quantum well structure.

13. A semiconductor chip having a semiconductor layer sequence having one or more layers comprising a III-phosphide compound semiconductor material or III-arsenide compound semiconductor material, wherein the semiconductor layer sequence contains a p-type semiconductor region and an n-type semiconductor region, wherein
the n-type semiconductor region comprises a superlattice structure for improving current spreading, the superlattice structure having a periodic arrangement of semiconductor layers,
a period of the superlattice structure has at least one undoped first semiconductor layer and a doped second semiconductor layer, an electronic band gap $E_2$ of the doped second semiconductor layer being larger than an electronic band gap $E_1$ of the undoped first semiconductor layer, the undoped first semiconductor layer is arranged in the superlattice structure in each case between an undoped first intermediate layer and an undoped second intermediate layer, the period of the superlattice structure consists of four layers, wherein in each period an undoped first intermediate layer, the undoped first semiconductor layer, an undoped second intermediate layer and the doped second semiconductor layer follow one another.

* * * * *